US008964482B2

(12) United States Patent
Mu et al.

(10) Patent No.: US 8,964,482 B2
(45) Date of Patent: Feb. 24, 2015

(54) DYNAMIC HEALING OF NON-VOLATILE MEMORY CELLS

(71) Applicants: Fuchen Mu, Austin, TX (US); Chen He, Austin, TX (US); Yanzhuo Wang, Austin, TX (US)

(72) Inventors: Fuchen Mu, Austin, TX (US); Chen He, Austin, TX (US); Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 81 days.

(21) Appl. No.: 13/755,606

(22) Filed: Jan. 31, 2013

(65) Prior Publication Data

US 2013/0194874 A1    Aug. 1, 2013

Related U.S. Application Data

(63) Continuation-in-part of application No. 13/361,191, filed on Jan. 30, 2012.

(51) Int. Cl.
*G11C 16/04* (2006.01)
*G11C 16/06* (2006.01)
*G11C 16/34* (2006.01)

(52) U.S. Cl.
CPC ............ *G11C 16/06* (2013.01); *G11C 16/3404* (2013.01); *G11C 16/349* (2013.01)
USPC .................................. 365/185.3; 365/185.23

(58) Field of Classification Search
USPC ............... 365/185.3, 185.23, 185.26, 185.28, 365/185.33
See application file for complete search history.

(56) References Cited

U.S. PATENT DOCUMENTS

| | | | |
|---|---|---|---|
| 5,508,959 A | 4/1996 | Lee et al. | |
| 5,619,454 A | 4/1997 | Lee et al. | |
| 6,426,898 B1 | 7/2002 | Mihnea et al. | |
| 6,484,232 B2 * | 11/2002 | Olarig et al. | ................... 711/105 |
| 6,493,280 B2 | 12/2002 | Mihnea et al. | |
| 7,495,966 B2 * | 2/2009 | Aritome | .................... 365/185.24 |
| 8,065,573 B2 | 11/2011 | Abts et al. | |
| 8,238,170 B2 | 8/2012 | Mihnea et al. | |
| 8,542,542 B2 | 9/2013 | Mihnea et al. | |
| 2002/0121653 A1 | 9/2002 | Mihnea et al. | |
| 2010/0025811 A1 | 2/2010 | Bronner et al. | |

(Continued)

OTHER PUBLICATIONS

"Structure and Method for Healing Tunnel Dielectric of Non-Volatile Memory Cells", U.S. Appl. No. 13/361,191, filed Jan. 30, 2012, 15 pgs.

(Continued)

*Primary Examiner* — Vu Le
(74) *Attorney, Agent, or Firm* — Egan, Peterman, Enders LLP

(57) ABSTRACT

Methods and systems are disclosed for dynamic healing of non-volatile memory (NVM) cells within NVM systems. The dynamic healing embodiments described herein relax damage within tunnel dielectric layers for NVM cells that occurs over time from charges (e.g., holes and/or electrons) becoming trapped within these tunnel dielectric layers. NVM operations with respect to which dynamic healing processes can be applied include, for example, erase operations, program operations, and read operations. For example, dynamic healing can be applied where performance for the NVM system degrades beyond a selected performance level for an NVM operation, such as elevated erase/program pulse counts for erase/program operations and bit errors for read operations. A variety of healing techniques can be applied, such as drain stress processes, gate stress processes, and/or other desired healing techniques.

20 Claims, 6 Drawing Sheets

(56) References Cited

U.S. PATENT DOCUMENTS

2010/0165747 A1     7/2010    Mihnea et al.
2012/0140569 A1*   6/2012    Goda et al. ............... 365/185.19

OTHER PUBLICATIONS

Office Action mailed Feb. 3, 2014, for Mu, "Structure and Method for Healing Tunnel Dielectric of Non-Volatile Memory Cells", U.S. Appl. No. 13/361,191, filed Jan. 30, 2012, 5 pgs.

Response to Office Action mailed May 5, 2014, for Mu, "Structure and Method for Healing Tunnel Dielectric of Non-Volatile Memory Cells", U.S. Appl. No. 13/361,191, filed Jan. 30, 2012, 8 pgs.

Partial European Search Report dated Jan. 8, 2014, for EP Application No. 13151698.1, 6 pages.

Extended European Search Report dated Feb. 19, 2014, for EP Application No. 13151698.1, 10 pages.

* cited by examiner

US 8,964,482 B2

DYNAMIC HEALING OF NON-VOLATILE MEMORY CELLS

RELATED APPLICATION

This patent application is a continuation-in-part application of co-pending U.S. patent application Ser. No. 13/361,191 entitled "STRUCTURE AND METHOD FOR HEALING TUNNEL DIELECTRIC OF NON-VOLATILE MEMORY CELLS," filed Jan. 30, 2012, which is incorporated herein by reference in its entirety.

TECHNICAL FIELD

This technical field relates to non-volatile memory (NVM) systems and, more particularly, to improving long term reliability of NVM systems.

BACKGROUND

Non-volatile memory (NVM) systems are used in a variety of electronic systems and devices. During the lifetime of an NVM system, however, cycling performance will degrade dramatically after a large number of cycles (e.g., 20,000 program/erase cycles) because of the accumulation of damage within NVM cells due to cycling. One example of such damage is the increasing number of charges (e.g., holes and electrons) that become trapped in tunnel oxides (i.e., trap-up) after large numbers of cycles for NVM systems that use tunnel dielectric layers. Because of this damage to tunnel dielectric layers as cycle counts rise, it is difficult to keep cycling performance at adequate levels as compared with early cycles within the product lifetime. Further, the damage not only degrades cycling performance, but it also degrades other reliability aspects, as well, such as DR (Data Retention), OL (Operating Life), read disturb, program disturb, and other reliability measures for NVM systems.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Methods and systems are disclosed for dynamic healing of non-volatile memory (NVM) cells within NVM systems. The dynamic healing embodiments described herein relax damage within tunnel dielectric layers for NVM cells that occurs over time from charges (e.g., holes and/or electrons) becoming trapped within tunnel dielectric layers. The dynamic healing processes improve performance and reliability, thereby extending product lifetimes. NVM operations with respect to which dynamic healing processes can be applied include, for example, erase operations, program operations, and read operations. For example, dynamic healing can be applied where performance for the NVM system degrades beyond a selected performance level for an NVM operation, such as elevated erase/program pulse counts for erase/program operations and bit errors for read operations. A variety of healing techniques can be applied, such as drain stress processes, gate stress processes, and/or other desired healing techniques. Further, by applying these healing techniques dynamically during NVM operations, healing is initiated more closely to the NVM operation where damage to the tunnel dielectric layers has caused performance to degrade beyond a selected performance level. Different features and variations can be implemented, as desired, and related or modified systems and methods can be utilized, as well.

Figure 1:
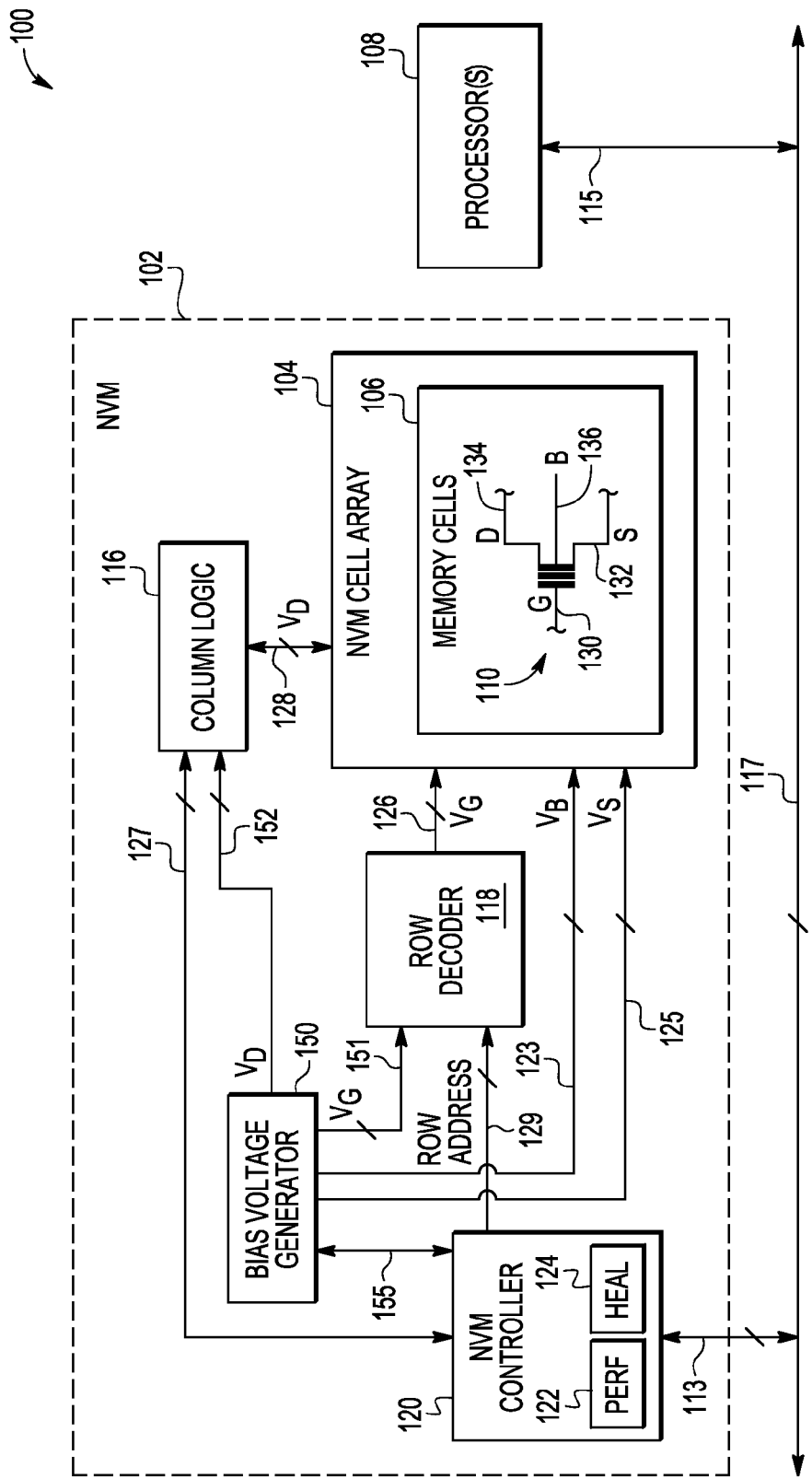
FIG. 1 is a block diagram of an integrated circuit including a non-volatile memory (NVM) system with dynamic healing according to one embodiment.

FIG. 1 is a block diagram of an integrated circuit 100 including a non-volatile memory (NVM) system 102 with dynamic healing according to one embodiment. For the embodiment depicted, the NVM system 102 and one or more processor(s) 108 are coupled to a communication bus 117 through connections 113 and 115, respectively. The NVM system 102 also includes an NVM controller 120, a row decoder 118, column logic 116, a bias voltage generator 150, and an NVM cell array 104. The NVM controller 120 includes a performance determination block (PERF) 122 and a healing block (HEAL) 124, which are used to provide dynamic healing of the NVM cells 106, as described herein. It is noted that the NVM system 102 can be integrated within a single integrated circuit with the one or more processors 108, can be implemented as stand-alone memory integrated circuit, or can be implemented in another desired configuration, as desired.

The NVM cell array 104 includes a plurality of NVM cells 106. Memory cell 110 represents one of the plurality of NVM memory cells 106. For the embodiment depicted, memory cell 110 is a floating gate type NVM memory cell having a gate (G) node 130, a source (S) node 132, a drain (D) node 134, and a body (B) node 136. For a floating gate NVM cell, a dielectric layer, a floating gate, and a tunnel dielectric layer will typically be located below the gate (G) node 130 (e.g., gate electrode) and above the channel region within the semiconductor substrate upon which the floating gate NVM cell is fabricated. It is noted that other NVM cell types could also be utilized, such as split-gate NVM cells, multi-level NVM cells, and/or other types of NVM cells, if desired.

During operation, the NVM controller 120 provides row addresses to the row decoder 118 through connections 129. The row decoder 118 drives selected wordlines with gate bias voltages ($V_G$) 126 applied to gate nodes 130 for selected row(s) of NVM cells 106 within the NVM cell array 104. The NVM controller 120 also provides column addresses to column logic 116 through connections 127. The column logic 116 drives selected bit-lines with drain bias voltages ($V_D$) 128 applied to drain nodes 134 for selected column(s) of NVM cells 106 within the NVM cell array 104. The column logic 116 is also used to access and read stored data values from the selected NVM cells 106 within the NVM cell array 104 through connections 128.

The bias voltage generator 150 is configured to generate a variety of bias voltages that are used for the operation of the NVM system 102. For example, the bias voltage generator 150 provides gate bias voltages 151 to row decoder 118 that are used to apply the gate bias voltages ($V_G$) 126. The bias voltage generator 150 also provides drain bias voltages 152 to column logic 116 that are used to apply the drain bias voltages ($V_D$) 128. Further, the bias voltage generator 150 provides body bias voltages ($V_B$) 123 to body nodes 136 for the NVM cells 106 within the NVM cell array 104, and the bias voltage generator 150 provides source bias voltages ($V_S$) 125 to source nodes 132 for the NVM cells 106 within the NVM cell array 104. The bias voltage generator 150 receives bias control signals 155 from the NVM controller 120 that control which bias voltages are provided by the bias voltage generator 150. It is further noted that the bias voltage generator 150 can be implemented as a single circuit block or as circuit blocks distributed in different locations throughout the NVM system 102, as desired.

The NVM controller 120 utilizes the performance determination block (PERF) 122 to detect performance information during NVM operations and to determine whether performance has degraded beyond predetermined levels. As described herein, a variety of NVM operations and related performance criteria can be utilized. If performance has degraded beyond selected levels, the NVM controller 120 utilizes the healing block (HEAL) 124 to dynamically heal the NVM cells 106. As described herein, a variety of healing processes can be utilized. The healing process can be repeated additional times, as desired, until the performance of the NVM operation is determined to meet desired performance levels. The NVM system 102 can then be reset for continued operation.

As one example, dynamic healing can be applied based upon cycling performance determinations made during erase/program operations. As described herein, cycling performance (e.g., erase pulse counts, program pulse counts) is checked against preset criteria to determine if performance has degraded beyond selected performance levels. As another example, dynamic healing can be applied based upon the detection of bit errors (e.g., single bit errors) during read operations. Other memory operations and related performance information could also be utilized to trigger the application of the dynamic healing process, if desired.

Once a determination has been made to apply dynamic healing, a variety of healing processes can be applied. For example, a drain stress voltage can be applied as the healing process and, if desired, can be applied to the whole NVM cell array 104 for a certain period of time. Gate stress voltages or other healing processes could also be utilized as desired. These other healing processes can also be applied to the whole array, if desired. Further, by making performance determinations and applying healing processes dynamically during or contemporaneously with NVM operations, healing is initiated more closely to the NVM operation where damage to the tunnel dielectric layers has caused performance to degraded beyond a selected performance level. Further, the speed of the healing process is also increased because junction temperature (e.g., between the drain and the channel region underneath the gate) will be elevated during memory operation (e.g., 105 to 150 degrees Celsius). Advantageously, these elevated temperatures facilitate the healing process.

It is noted that the healing process can be applied to heal a variety of cell damage types within tunnel dielectric layers, including damage to intrinsic and extrinsic bit cells, damage due to hole trapping effects, damage due to electron trapping effects, and other damage sources. Further, the healing process can be performed with normal data states and, if desired, can be performed in power-down sequences to avoid the need to interrupt the operation of the NVM cell. The healing processes help to de-trap trapped charges, thus deactivating traps within the dielectric layers. This de-trapping improves cycling performance and reduces the occurrence of bit errors. Advantageously, the dynamically healing described herein is configured to be transparent to the user. Further, the NVM system can be configured to allow external control to enable and/or disable the dynamic healing feature (e.g., by an external user).

Figure 2:
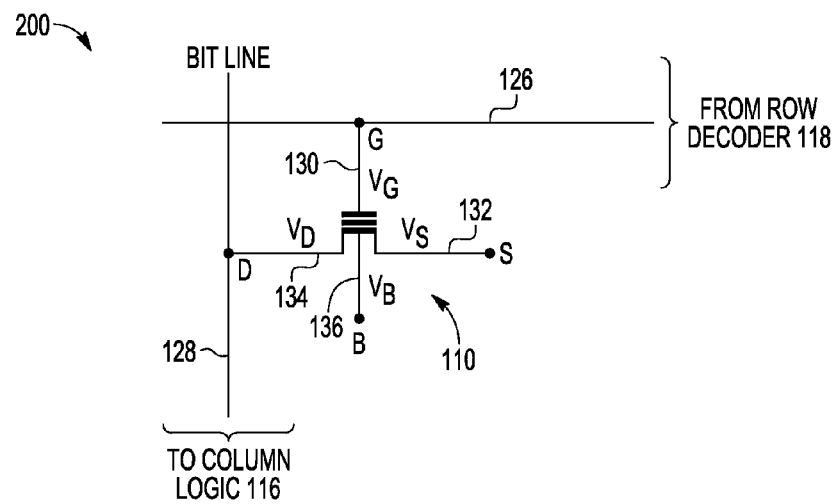
FIG. 2 is a connection diagram of an example embodiment for connections to a non-volatile memory (NVM) cell.

FIG. 2 is a connection diagram of an example embodiment 200 for connections to an NVM cell 110. During an operation, the NVM memory cell 110 has its body (B) 136 connected to a body bias voltage ($V_B$) and has its source (S) 132 connect to a source bias voltage ($V_S$), for example, as provided by the bias voltage generator 150 as described above. The NVM cell 110 has its drain (D) 134 coupled to the column logic 116 through one of the bit-line connections 128 to receive a drain bias voltage ($V_D$). The NVM cell 110 has its gate (G) 130 coupled to the row decoder 118 through one of the connections 126 to receive a gate bias voltage ($V_G$). Depending upon the operation to be performed for the NVM memory cells 104, different body, source, drain, and gate bias voltages ($V_B$, $V_S$, $V_D$, $V_G$) are applied to the body (B) nodes 136, source (S) nodes 132, drain (D) nodes 134, and gate (G) nodes 130 for selected NVM memory cells 106.

As described above, the healing process can include, but is not limited to, applying gate bias stress voltages, drain bias stress voltages, or both. Further, additional or different healing processes can also be applied, as desired. TABLE 1 below provides examples for gate stress bias voltages and drain stress bias voltages that can be applied to provide the dynamic healing described herein.

TABLE 1

| EXAMPLE HEALING STRESS VOLTAGES | | |
| --- | --- | --- |
| Node | Drain Stress | Gate Stress |
| Gate (G) | GND | 6.0 to 9.0 volts |
| Drain (D) | 3.0 to 5.0 volts | GND |
| Body (B) | GND | GND |
| Source(S) | GND | GND |

As set forth in the examples for TABLE 1, for drain stress healing, a drain (D) bias voltage is applied. This drain stress voltage may be, for example, between 3.0 and 5.0 volts, if desired. As one further example, a drain stress voltage of about 4.2 volts can be used. For gate stress healing, a gate (G) bias voltage is applied. This gate dress voltage may be, for example, between 6.0 and 9.0 volts, if desired. As one further example, a gate stress voltage of about 8.5 volts can be used. As stated above, gate stress healing, drain stress healing, or both can be applied, as desired. Further, the drain stress voltages and/or the gate stress voltages can be applied for a selected duration of time, such as 1 to 100 seconds, if desired. As one further example, the stress voltages can be applied for about 10 seconds. Other time durations could also be used, if desired.

Figure 3:
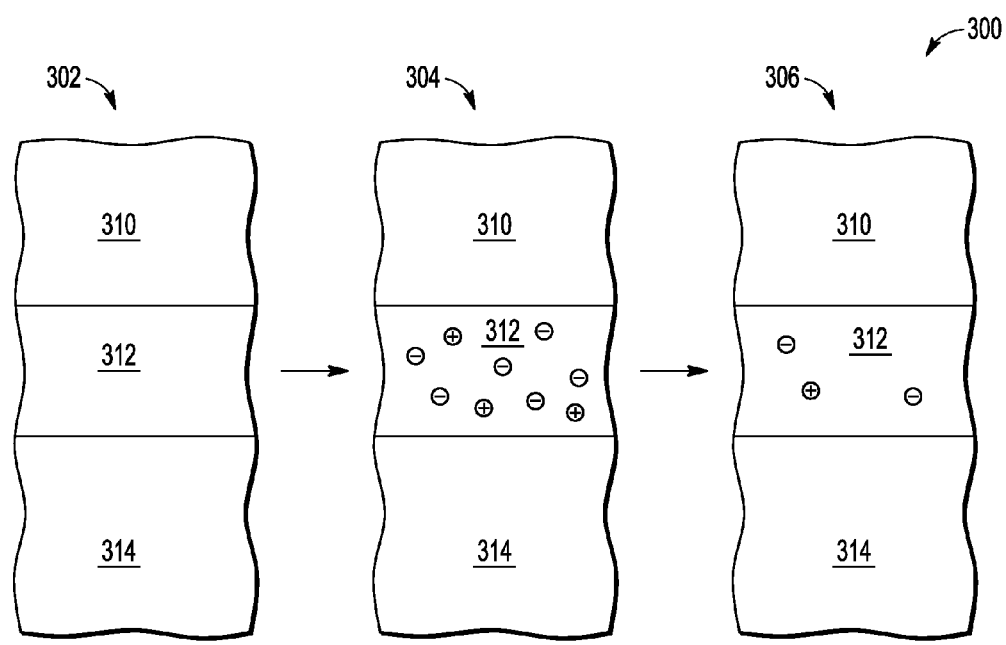
FIG. 3 is a cross-section diagram of an embodiment for damage to and healing of a tunnel dielectric layer in an NVM cell.

FIG. 3 is a cross-section diagram of an embodiment 300 for damage to and healing of a dielectric layer 312 in an NVM cell 110. For this embodiment, the NVM cell 110 is assumed to be a floating gate type NVM cell that includes in part a tunnel dielectric layer 312. The tunnel dielectric layer 312 is located below a floating gate electrode 310 and above a channel region 314 within a semiconductor substrate. Three stages 302, 304, and 306 are shown for different conditions of the tunnel dielectric layer 312. At stage 302, a low number of program/erase cycles have been performed, and there is no discernible charge trapping in tunnel dielectric layer 312. At stage 304, a significant number of program/erase cycles (e.g., 20,000 cycles) have been performed, and charge trapping has occurred that can affect endurance and data retention. As described herein, dynamic healing is applied during or contemporaneously with an NVM operation to heal NVM cells when degraded performance is detected that exceeds selected criteria during an NVM operation. At stage 306, after dynamic healing has been performed as described herein, the trapped charges have been significantly reduced in tunnel dielectric layer 312. Thus, the NVM cells have been dramatically recovered through the dynamic healing process.

Figure 4:
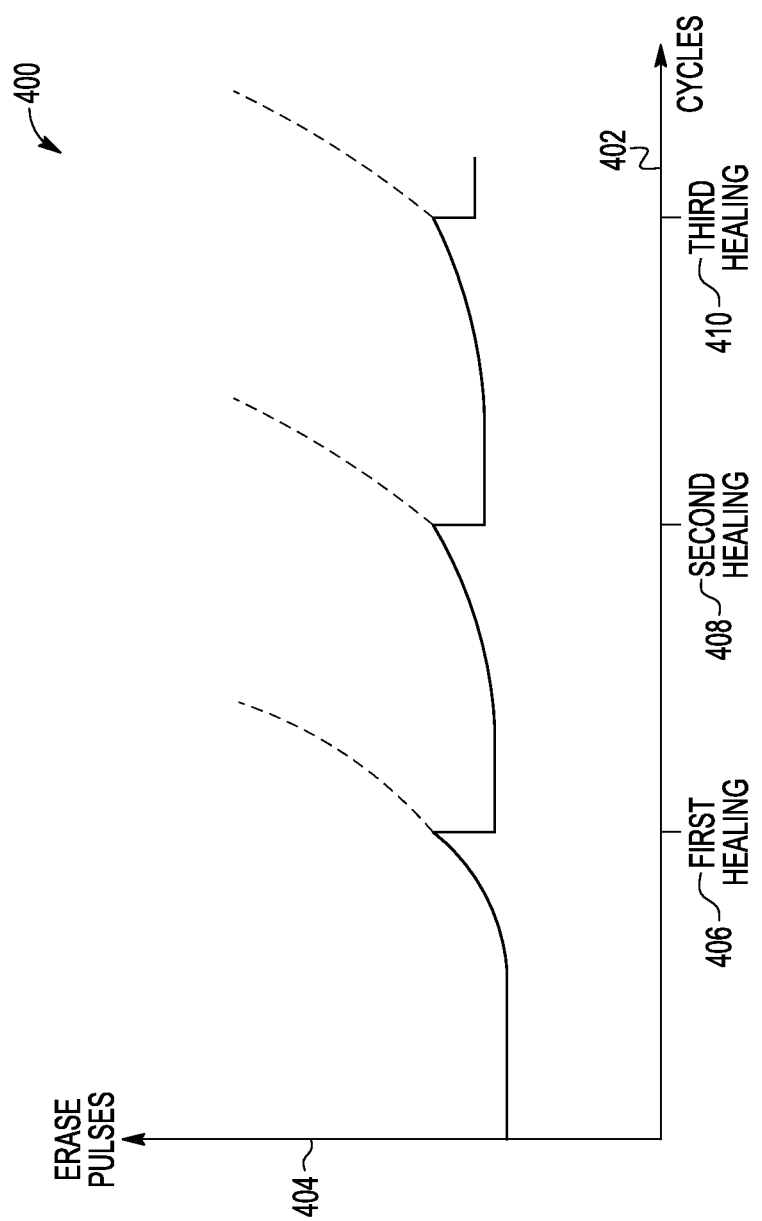
FIG. 4 is a diagram of an embodiment for improvement to erase pulses counts based upon dynamic healing applied due to elevated erase pulse counts detected during erase operations.

FIG. 4 is a diagram of an embodiment 400 for improvement to erase pulse counts based upon healing events applied when erase pulse counts exceed selected criteria during erase operations. During erase operations for the NVM system, erase pulses are applied until an erase verify operation indicates that the erase operation has successfully completed. Early in operational life of the NVM system 102, the number of erase pulses per cycle (i.e., erase pulse count) is relatively stable and increases slowly. After a large number of cycles (e.g., 20,000 cycles), however, the erase pulse counts will begin to increase exponentially. As described herein, if the erase pulse count required during an erase operation exceeds a selected threshold, a first healing 406 is performed. After healing, the number of erase pulses required to erase NVM cells will tend to be reduced to nearly the initial erase pulse count level. The dotted line shows that the erase pulse counts would continue to increase in the absence of the dynamic healing. If the erase pulse count again exceeds a selected threshold, a second healing 408 can then be performed to again reduce the required number of erase pulses. Similarly, if the erase pulse count again exceeds a selected threshold, a third healing 410 can be applied to again drop the erase pulse count back to a lower level. This dynamic healing continues to occur when erase pulse counts exceed selected criteria. It is noted that similar dynamic healing processes can be implemented with respect to program pulse counts during NVM program operations, detected bit errors during NVM read operations, and/or based upon other selected criteria that is detected during NVM operations, as desired.

Thus, the dynamic healing process can be applied after a number of pulses required to program and/or erase NVM cells has increased above baseline amounts by a selected amount and/or percentage. As one example, if an erase pulse count for an erase operation exceeds an initial baseline number by a selected amount, the healing process is applied. For example, if the initial baseline number is twenty-seven (27) erase pulses and the selected amount were five (5) or more, then the healing process would be triggered if the erase pulse count exceeded a selected performance threshold of thirty-two (32) or more erase pulses. As another example, if a program pulse count for a program operation exceeds an initial baseline number by a selected amount, the healing process is applied. For example, if the initial baseline number is four (4) program pulses and the selected amount were three (3), then the healing process would be triggered if the program pulse count exceeded a selected performance threshold of seven (7) or more program pulses. For each of these examples, it is again noted that the baseline values and/or performance thresholds can be adjusted after one or more dynamic healing processes have been applied, if desired.

Figure 5:
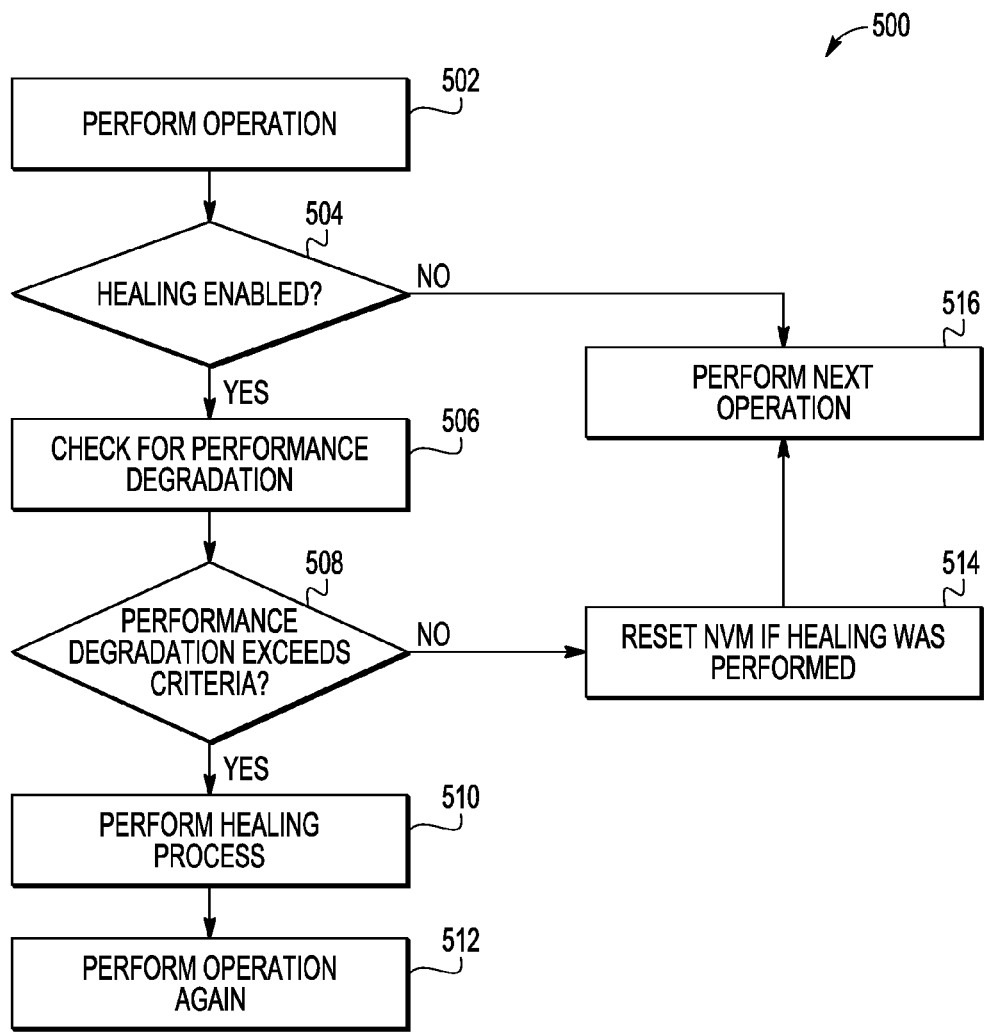
FIG. 5 is a process flow diagram of an embodiment for dynamic healing of non-volatile memory (NVM) cells.

FIG. 5 is a process flow diagram of an embodiment 500 for dynamic healing of non-volatile memory cells. In block 502, an NVM operation is performed (e.g., program, erase, program verify, erase verify, read). In block 504, a determination is made whether dynamic healing is enabled. If "NO," then flow passes to block 516 where the next NVM operation is performed. If "YES," then flow passes to block 506 where a check is made for performance degradation. Next, in block 508, a determination is made whether the performance degradation exceeds a predetermined criterion. If "YES," then flow passes to block 510 where a healing process is performed. As described herein, the healing process can include a drain stress voltage, a gate stress voltage, and/or some other desired healing operation. Next, block 512 is reached where the NVM operation is performed again. Flow then passes back to block 506 where a check is again made for performance degradation. If the determination in block 508 is "NO," then flow passes to block 514 where the NVM cells are reset, if a healing was performed. Flow then passes to block 516 where the NVM system is ready for the next operation.

Figure 6:
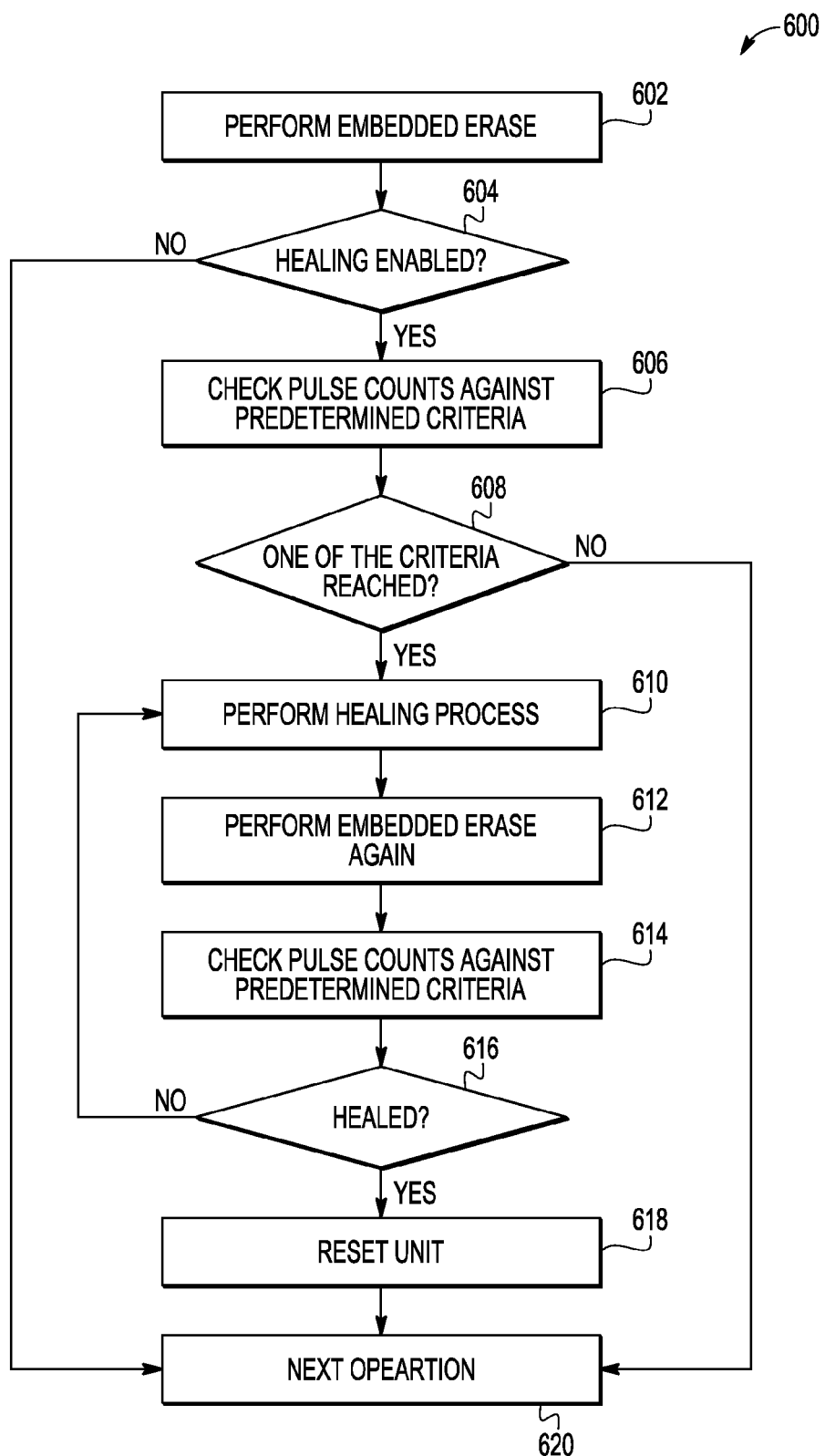
FIG. 6 is a process flow diagram of an embodiment for dynamic healing of non-volatile memory (NVM) cells based upon erase pulse counts during erase operations.

FIG. 6 is a process flow diagram of an embodiment 600 for dynamic healing of non-volatile memory cells based upon erase pulse counts during erase operations. In block 602, an embedded erase operation is performed. Next, in block 604, a determination is made whether healing is enabled. If "NO," then flow passes to block 620 where the NVM system is ready for the next operation. If "YES," then flow passes to block 606 where erase pulse counts are checked against predetermined criteria. Next, in block 608, a determination is made whether one or more of the criteria has been reached (e.g., if the erase pulse count exceeds a predetermined limit). If "NO," flow passes to block 620 where the NVM system is ready for the next operation. If "YES," flow passes to block 610 wherein a healing process is performed, as described herein. Flow then passes to block 612 where an embedded erase operation is again performed. In block 614, erase pulse counts are again checked against predetermined criteria. Next, in block 616, a determination is made whether the NVM cells have been healed (e.g., if the erase pulse count is below the predetermined limit). If "NO," flow passes back to block 610 to perform the healing process again. If "YES," then flow passes to block 618 where the NVM cells are reset. Flow then passes to block 620 where the NVM system is ready for the next operation.

Figure 7:
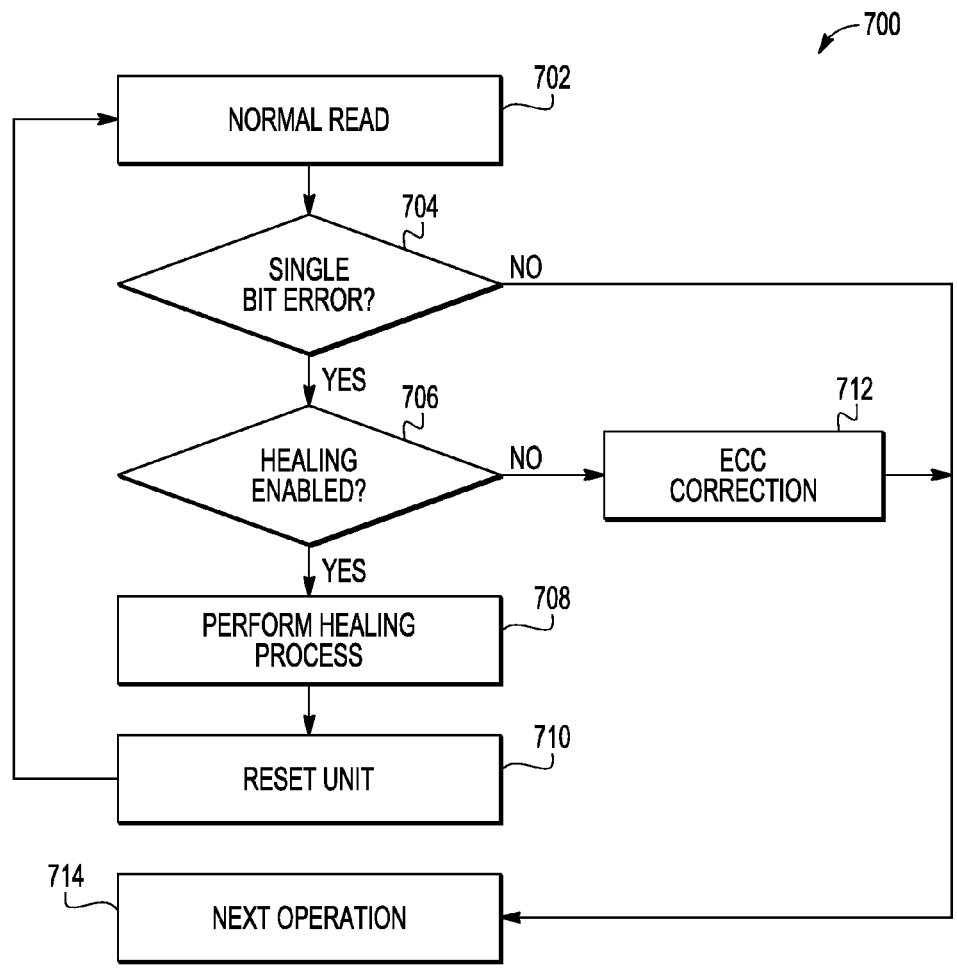
FIG. 7 is a process flow diagram of an embodiment for dynamic healing of non-volatile memory (NVM) cells based upon bit error detections during read operations.

FIG. 7 is a process flow diagram of an embodiment 700 for dynamic healing of non-volatile memory cells based upon bit error detections during read operations. In block 702, a normal read operation is performed. In block 704, a determination is made whether a bit error, such as a single bit error, has occurred with respect to the read operation. If "NO," flow passes to block 714 where the next operation is performed. If "YES," then flow passes to block 706 where a determination is made whether healing is enabled. If "NO," then flow passes to block 712 where ECC (error correction code) correction processing is applied to correct the single bit error. Flow then proceeds to block 714 where the NVM system is ready for the next operation. If the determination in block 706 is "YES," flow passes to block 708 where a healing process is performed. Flow then passes to block 710 where the NVM cells are reset. Flow then passes back to block 702 where another normal read operation is performed.

It is again noted that the dynamic healing described herein is preferably applied to normal data states based upon performance criteria, such as cycling performance and/or detection of single-bit errors. This application of the dynamic healing processes to normal data states during operation achieves self-healing effects by relaxing the damage without interruption of the bitcell operation. Further, healing processes, such as bias stress, can be applied to some or all of the NVM cells, regardless of the magnitude of the damage. Further, the healing process is not solely for extrinsic bits, but can be applied to heal both hole trapping and electron trapping. Further, by applying the healing processes during or contemporaneously with NVM operations, the healing techniques described herein are initiated more closely to the NVM operation where damage to the tunnel dielectric layers has caused performance to degrade beyond a selected performance level. Further, the healing techniques take advantage of elevated junction temperatures (e.g., 105 to 150 degrees Celsius) for the NVM cells during and subsequent to memory operations. These high junction temperatures accelerate relaxation of damage to dielectric layers. Once the healing process has been applied, the NVM system and/or cells can be reset, and operations can continue.

It is further noted that healing enable flags or other programmable techniques can be utilized to allow control (e.g., external control by an external user) of when healing is enabled and/or disabled for a particular NVM operation and/or for a one or more NVM blocks within the NVM system. It is further noted that NVM systems can be configured to have one or more separately configurable blocks of NVM cells, such that one NVM operation (e.g., read) can be performed within one or more block of NVM cells, while different a NVM operation (e.g., erase/program cycling with dynamic healing) is performed within one or more other blocks of NVM cells. One benefit of the ability to independently enable healing for one or more blocks of NVM cells within the NVM system is that a user's application can run on one block of NVM cells, while the dynamic healing can be initiated and applied on another block of NVM cells without impacting the user's application.

As described herein, a variety of embodiments can be implemented and different features and variations can be implemented, as desired.

One disclosed embodiment is a method for dynamic healing of non-volatile memory (NVM) cells including performing a memory operation for one or more non-volatile memory (NVM) cells within an NVM system where each NVM cell having a tunnel dielectric layer, determining performance information related to the memory operation, and applying a healing process to the NVM cells if performance for the NVM cells has degraded beyond a selected performance level based upon the performance information, where the healing process is configured to heal damage to the tunnel dielectric layers within the NVM cells. In further embodiments, the applying step is performed while junction temperatures within the NVM cells are at elevated temperature levels.

In other embodiments, the memory operation can include at least one of an erase operation or a program operation. The performance information can include an erase pulse count if the memory operation comprises the erase operation. And the performance information can include a program pulse count if the memory operation comprises the program operation. Still further, the memory operation can be a read operation, and the performance information comprises a bit error detected for the read operation. For still further embodiments, after a healing process is applied, the performing, determining, and applying steps are repeated until performance for the NVM cells is determined to meet a selected performance level. For other further embodiments, the performing, determining, and applying steps are repeated over time and adjusting the selected performance level after one or more applying steps have been performed. Still further, embodiments can further include determining if healing is enabled before performing the determining and applying steps. Further, the method can include allowing healing to be independently enabled for two or more blocks of NVM cells.

For further embodiments, the applying step can include applying a drain stress voltage to drain nodes for the NVM cells where each NVM cell is configured to have drain node, a source node, and at least one gate node. In addition, the drain stress voltage can be a voltage of 3.0 volts to 5.0 volts applied for 1 to 100 seconds. For other embodiments, the applying step can include applying a gate stress voltage to gate nodes for the NVM cells where each NVM cell is configured to have drain node, a source node, and at least one gate node. In addition, the gate stress voltage comprises a voltage of 6.0 volts to 9.0 volts applied for 1 to 100 seconds.

Another disclosed embodiment is a non-volatile memory (NVM) system including an array of non-volatile memory (NVM) cells with, each NVM cell having a tunnel dielectric layer and controller circuitry configured to perform a memory operation for one or more of the NVM cells, to determine performance information for the memory operation, and to apply a healing process to the NVM cells if performance for the NVM cells has degraded beyond a selected performance level based upon the performance information, where the healing process is configured to heal damage to the tunnel dielectric layers within the NVM cells.

In other embodiments, the memory operation includes an erase operation, and the performance information includes an erase pulse count for the erase operation. Still further, the memory operation can include a program operation, and the performance information can include a program pulse count for the program operation. For further embodiments, the memory operation includes a read operation, and the performance information includes a bit error detected for the read operation. Still further, the controller circuitry can be further configured to determine if healing is enabled before the healing process is applied. In addition, the controller circuitry can be further configured to independently determine if healing is enabled for one or more blocks of NVM cells.

For further embodiments, each NVM cell can include a drain node, a source node, and at least one gate node, and the controller circuitry can be configured to apply a drain stress voltage to drain nodes for the NVM cells as the healing process. For still further embodiments, each NVM cell can include a drain node, a source node, and at least one gate node, and the controller circuitry can be configured to apply a gate stress voltage to drain nodes for the NVM cells as the healing process.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for dynamic healing of non-volatile memory (NVM) cells, comprising:
   performing a memory operation for one or more non-volatile memory (NVM) cells within an NVM system, each NVM cell having a tunnel dielectric layer, a drain node, a source node, and at least one gate node;
   determining performance information related to the memory operation; and
   applying a healing process to the NVM cells if performance for the NVM cells has degraded beyond a selected performance level based upon the performance information;
   wherein the applying step comprises at least one of applying a drain stress voltage to the drain nodes for the NVM cells or applying a gate stress voltage to the gate nodes for the NVM cells; and
   wherein the healing process is configured to heal damage to the tunnel dielectric layers within the NVM cells.

2. The method of claim 1, wherein the applying step is performed while junction temperatures within the NVM cells are at elevated temperature levels.

3. The method of claim 1, wherein the memory operation comprises at least one of an erase operation or a program operation, wherein the performance information comprises an erase pulse count if the memory operation comprises the erase operation, and wherein the performance information comprises a program pulse count if the memory operation comprises the program operation.

4. The method of claim 1, wherein the memory operation comprises a read operation and wherein the performance information comprises a bit error detected for the read operation.

5. The method of claim 1, wherein after the healing process is applied, repeating the performing, determining, and applying steps until performance for the NVM cells is determined to meet the selected performance level.

6. The method of claim 1, further comprising repeating the performing, determining, and applying steps over time and adjusting the selected performance level after one or more applying steps have been performed.

7. The method of claim 1, further comprising determining if healing is enabled before performing the determining and applying steps.

8. The method of claim 7, further comprising allowing healing to be independently enabled for two or more blocks of NVM cells.

9. The method of claim 1, wherein the drain stress voltage, if applied, comprises a voltage of 3.0 volts to 5.0 volts applied for 1 to 100 seconds.

10. The method of claim 1, wherein the gate stress voltage, if applied, comprises a voltage of 6.0 volts to 9.0 volts applied for 1 to 100 seconds.

11. A non-volatile memory (NVM) system, comprising:
    an array of non-volatile memory (NVM) cells, each NVM cell having a tunnel dielectric layer, a drain node, a source node, and at least one gate node;
    controller circuitry configured to perform a memory operation for one or more of the NVM cells, to determine performance information for the memory operation, and to apply a healing process to the NVM cells if performance for the NVM cells has degraded beyond a selected performance level based upon the performance information;
    wherein the controller circuitry is further configured to apply at least one of a drain stress voltage to the drain nodes for the NVM cells as the healing process or a gate stress voltage to the gate nodes for the NVM cells as the healing process; and
    wherein the healing process is configured to heal damage to the tunnel dielectric layers within the NVM cells.

12. The NVM system of claim 11, wherein the memory operation comprises an erase operation and wherein the performance information comprises an erase pulse count for the erase operation.

13. The NVM system of claim 11, wherein the memory operation comprises a program operation and wherein the performance information comprises a program pulse count for the program operation.

14. The NVM system of claim 11, wherein the memory operation comprises a read operation and wherein the performance information comprises a bit error detected for the read operation.

15. The NVM system of claim 11, wherein the controller circuitry is further configured to determine if healing is enabled before the healing process is applied.

16. The NVM system of claim 15, wherein the controller circuitry is further configured to independently determine if healing is enabled for one or more blocks of NVM cells.

17. The NVM system of claim 11, wherein the drain stress voltage comprises a voltage of 3.0 volts to 5.0 volts applied for 1 to 100 seconds, if the controller circuitry is configured to apply a drain stress voltage.

18. The NVM system of claim 11, wherein the gate stress voltage comprises a voltage of 6.0 volts to 9.0 volts applied for 1 to 100 seconds, if the controller circuitry is configured to apply a gate stress voltage.

19. The NVM system of claim 11, wherein the controller circuitry is further configured to repeat the healing process until performance for the NVM cells is determined to meet the selected performance level.

20. The NVM system of claim 11, wherein the controller circuitry is further configured to adjust the selected performance level after one or more healing processes have been applied.

* * * * *